United States Patent
Arai et al.

(10) Patent No.: US 7,230,281 B2
(45) Date of Patent: Jun. 12, 2007

(54) SEMICONDUCTOR LIGHT EMITTING DEVICE

(75) Inventors: Masahiro Arai, Ishioka (JP); Taichiroo Konno, Tsuchiura (JP); Kazuyuki Iizuka, Tsuchiura (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 47 days.

(21) Appl. No.: 11/165,568

(22) Filed: Jun. 24, 2005

(65) Prior Publication Data

US 2006/0220032 A1   Oct. 5, 2006

(30) Foreign Application Priority Data

Mar. 15, 2005  (JP)  ............... 2005-073248

(51) Int. Cl.
    *H01L 33/00* (2006.01)
(52) U.S. Cl. ......................... 257/98; 257/102
(58) Field of Classification Search ................ 257/94, 257/96, 97, 103, 79, 98, 99, 102, 101
See application file for complete search history.

(56) References Cited

U.S. PATENT DOCUMENTS 5,068,868 A * 11/1991 Deppe et al. ............ 372/45.01
6,057,562 A    5/2000 Lee et al.
6,350,997 B1   2/2002 Saeki
6,984,850 B2 * 1/2006 Nakatsu et al. ............ 257/94
2003/0235226 A1* 12/2003 Ueki ........................... 372/46

FOREIGN PATENT DOCUMENTS

JP           8-83927       3/1996
JP          11-307810     11/1999

* cited by examiner

*Primary Examiner*—Howard Weiss
*Assistant Examiner*—(Vikki) Hoa B. Trinh
(74) *Attorney, Agent, or Firm*—McGinn IP Law Group, PLLC

(57) ABSTRACT

A semiconductor light emitting device has: a semiconductor substrate; a semiconductor layer having an n-type cladding layer, an active layer, a p-type cladding layer and a p-type contact layer, wherein the p-type contact layer is made of an As-based material and located at the top of the semiconductor layer and doped with a p-type dopant at a concentration of $1 \times 10^{19}/cm^3$ or more; a current spreading layer formed on the semiconductor layer and made of a metal oxide material; and a diffusion prevention layer formed between the p-type contact layer and the p-type cladding layer. The diffusion prevention layer is made of a group III–V semiconductor that has phosphorus as a group V element and has a crystal lattice mismatch ratio of within ±0.3% to the semiconductor substrate.

12 Claims, 2 Drawing Sheets

SEMICONDUCTOR LIGHT EMITTING DEVICE

The present application is based on Japanese patent application No. 2005-073248, the entire contents of which are incorporated herein by reference.

BACKGROUND OF THE INVENTION

1. Field of the Invention

This invention relates to a semiconductor light emitting device and, particularly, to a semiconductor light emitting device that a transparent conductive film is used as a current spreading layer. Herein, a semiconductor light emitting device includes a light emitting diode or LED.

2. Description of the Related Art

Conventionally, most of light emitting diodes (herein referred to as LED) as a semiconductor light emitting device had been green LED's of GaP and red LED's of AlGaAs. However, in recent years, GaN-based and AlGaInP-based high quality crystals can be grown by MOVPE (metalorganic vapor phase epitaxy). Thereby, high-brightness LED's with an emission color of blue, green, orange, yellow and red can be fabricated.

An epitaxial wafer fabricated by MOVPE allows LED to have a short-wavelength emission or a high brightness that was not developed thus far. However, in order to obtain an LED with a high brightness, the current spreading property needs to be improved so as to allow current to be uniformly flown into the chip surface of LED. For example, in an AlGaInP-based LED, its current spreading layer needs to have an increased thickness of 5 to 10 µm. Since the material cost for the growth of the current spreading layer is increased, the manufacturing cost of LED must be increased. Thus, this prevents the cost reduction of the AlGaInP-based LED.

Japanese patent application laid-open No. 8-83927 discloses a method that a metal oxide such as ITO (indium tin oxide) and ZnO (zinc oxide) is used as the current spreading layer while having a sufficient light-transmitting property and an electrical property such as a good current spreading property.

A transparent conductive film comprising the metal oxide can have a sufficient current spreading property even in small thickness since its carrier concentration is so high. When the ITO film is used as the current spreading layer, the semiconductor current spreading layer with the increased thickness used conventionally need not be grown. Therefore, the manufacturing cost of the LED or LED epitaxial wafer can be reduced.

However, in case of using the ITO film as a window layer, a contact resistance is generated between the semiconductor layer and the ITO film of metal oxide. Therefore, the forward operation voltage must increase. Namely, the ITO film as a transparent conductive film (or transparent electrode) is of an n-type semiconductor, and an upper contact layer in contact with the ITO film is of a p-type semiconductor. Thus, when a forward operation voltage is applied to the LED, a reverse bias is generated between the transparent conductive film (transparent electrode) and the p-type cladding layer. As a result, little current flows therebetween.

In order to solve the problem, it may be assumed that a thin contact layer with a high carrier concentration is formed in contact with the ITO film so as to operate the LED at a low voltage by tunnel junction. For example, the contact layer may be an As-based contact layer doped with a p-type dopant at a high concentration of $1 \times 10^{19}/cm^3$ or more.

However, the contact layer needs to be composed such that it generates the tunnel junction and it does not absorb light emitted from the active layer as much as possible. Therefore, the contact layer needs to be thinned while having a high carrier concentration. Because of this, the contact layer is likely to generate the diffusion of dopant due to heat etc. in the crystal growth. The diffusion of p-dopant in the contact layer causes the next two problems.

(i) The first problem is to cause a reduction in light output of the LED. The p-dopant is concentration—diffused in the depth direction of the LED from the contact layer. If it is diffused into the active layer, it becomes a defect in the active layer. The defect composes nonradiative recombination center. As a result, the light output of LED lowers.

(ii) The second problem is to increase the drive voltage (forward operation voltage) of LED. Due to the diffusion of p-dopant, the carrier concentration of the contact layer as a thinned and high-carrier concentration layer substantially lowers. Therefore, the tunnel junction is difficult to generate. Thus, since the tunnel voltage increases, the drive voltage of LED increases.

SUMMARY OF THE INVENTION

It is an object of the invention to provide a semiconductor light emitting device that the diffusion of a dopant from the contact layer can be effectively suppressed to prevent a reduction in light output during the operation and an increase in drive voltage of the semiconductor light emitting device as well as having a high brightness and a low initial operation voltage.

According to the invention, a semiconductor light emitting device comprises:

a semiconductor substrate;

a semiconductor layer comprising an n-type cladding layer, an active layer, a p-type cladding layer and a p-type contact layer, wherein the p-type contact layer is made of an As-based material and located at the top of the semiconductor layer and doped with a p-type dopant at a concentration of $1 \times 10^{19}/cm^3$ or more;

a current spreading layer formed on the semiconductor layer and made of a metal oxide material; and a diffusion prevention layer formed between the p-type contact layer and the p-type cladding layer, wherein the diffusion prevention layer comprises a group III–V semiconductor that comprises phosphorus as a group V element and has a crystal lattice mismatch ratio of within ±0.3% to the semiconductor substrate.

Herein, the lattice mismatch ratio is calculated by equation: (lattice mismatch ratio)=$(a_{epitaxial\ layer} - a_{substrate})/a_{substrate}$, where $a_{epitaxial\ layer}$ is a lattice constant of an epitaxial layer and $a_{epitaxial\ layer}$ is a lattice constant of a substrate.

It is preferred that the current spreading layer comprises ITO.

It is also preferred that the current spreading layer comprises a thickness D to satisfy $(7/10)d \leq D \leq (13/10)d$, where a thickness d of an ideal current spreading layer is $d = A \times \lambda_P/(4 \times n)$, A: a constant, $\lambda_P$: an emission peak wavelength of the light emitting device, and n: a refractive index of the current spreading layer, and the constant A is a positive odd number.

It is further preferred that the current spreading layer is formed by vacuum deposition or sputtering and has a carrier concentration of $8 \times 10^{20}/cm^3$ or more just after the current spreading layer is formed.

It is further preferred that the n-type cladding layer, the active layer and the p-type cladding layer are composed of $(Al_XGa_{1-X})_YIn_{1-Y}P$, where $0 \leq X \leq 1$ and $0.4 \leq Y \leq 0.6$ are satisfied.

It is further preferred that the p-type contact layer is doped with the p-type dopant comprising zinc and has a carrier concentration of $1 \times 10^{19}/cm^3$ or more and is composed of $Al_XGa_{1-X}As$, where $0 \leq X \leq 0.2$ is satisfied.

It is further preferred that the p-contact layer has a thickness of 1 nm or more and 30 nm or less.

It is further preferred that the diffusion prevention layer has a thickness of 0.5 μm or more and 5 μm or less.

It is further preferred that the diffusion prevention layer is optically transparent to an emission wavelength of the semiconductor light emitting device.

It is further preferred that the diffusion prevention layer is composed of AlInP or AlGaInP.

FEATURES OF THE INVENTION

The invention is featured in that the current spreading layer is composed of a conductive transparent film such as ITO, the thin p-type contact layer with a high carrier concentration is formed in contact with the current spreading layer, and the diffusion prevention layer is formed between the p-type contact layer and the p-cladding layer, wherein the diffusion prevention layer is composed of a group III–V semiconductor containing phosphorus (P) as a group V element.

In order to operate the LED at a low voltage by the tunnel junction, the p-type contact layer needs to have a high carrier concentration and to be thinned. Thus, since it is thinned and generally doped with a p-dopant, e.g., zinc at a high concentration of $1 \times 10^{19}/cm^3$ or more, the p-dopant, zinc diffuses from the p-type contact layer to cause problems. Namely, the p-dopant, zinc diffuses in concentration to the depth direction of the LED to cause a reduction of light output. Further, the drive voltage (forward operation voltage) increases since the carrier concentration of the p-type contact layer lowers due to the zinc diffusion.

To solve the problems, it is assumed effective that a diffusion prevention layer to prevent the zinc diffusion is provided between the p-type contact layer and the p-type cladding layer. For example, AlGaAs or AlAs is optically transparent to an emission wavelength of the LED and is easy to grow as compared to a quaternary material such as AlGaInP and nearly lattice-matches to the AlGaInP-based material composing the active layer. Therefore, it is apparently assumed that AlGaAs or AlAs can be applied to the diffusion prevention layer so as to lower the operation voltage of the LED.

However, after many researches, the inventors found that the problems of zinc diffusion are significant when the diffusion prevention layer is composed of a material, such as AlGaAs with a high Al composition, which contains As as a group V element and is transparent to the emission wavelength, and thus AlGaAs and AlAs is improper.

Therefore, in the invention, AlGaAs and AlAs are not used as a material for the diffusion prevention layer which is provided between the As-based contact layer highly doped with the p-dopant and the p-cladding layer. Instead, the invention is invented based on the following two conditions.

(i) The first condition is that the diffusion prevention layer is composed of a group III–V semiconductor containing phosphorus (P) as a group V element instead of the As-based material, such as AlGaAs with a high Al composition, transparent to the emission wavelength. Thereby, the LED can have excellent initial characteristics and a high reliability on light output and operation voltage.

(ii) The second condition is that the diffusion prevention layer is composed of a group III–V semiconductor to lattice-match to the semiconductor substrate instead of a wide bandgap material, such as GaP, P-based material, to cause a lattice mismatch. Thereby, the initial operation voltage can be reduced.

Examples of group III–V semiconductor to satisfy all the two conditions are AlGaInP and AlInP, which are optically transparent to the emission wavelength.

ADVANTAGES OF THE INVENTION

In the invention, the diffusion prevention layer containing phosphorus (P) as a group V element and to be substantially in crystal lattice match to the semiconductor substrate is provided between the As-based contact layer highly doped with the p-dopant and the p-cladding layer. Therefore, the diffusion of a dopant from the contact layer can be effectively suppressed to prevent a reduction in light output during the operation and an increase in drive voltage of the semiconductor light emitting device as well as having a high brightness and a low initial operation voltage.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
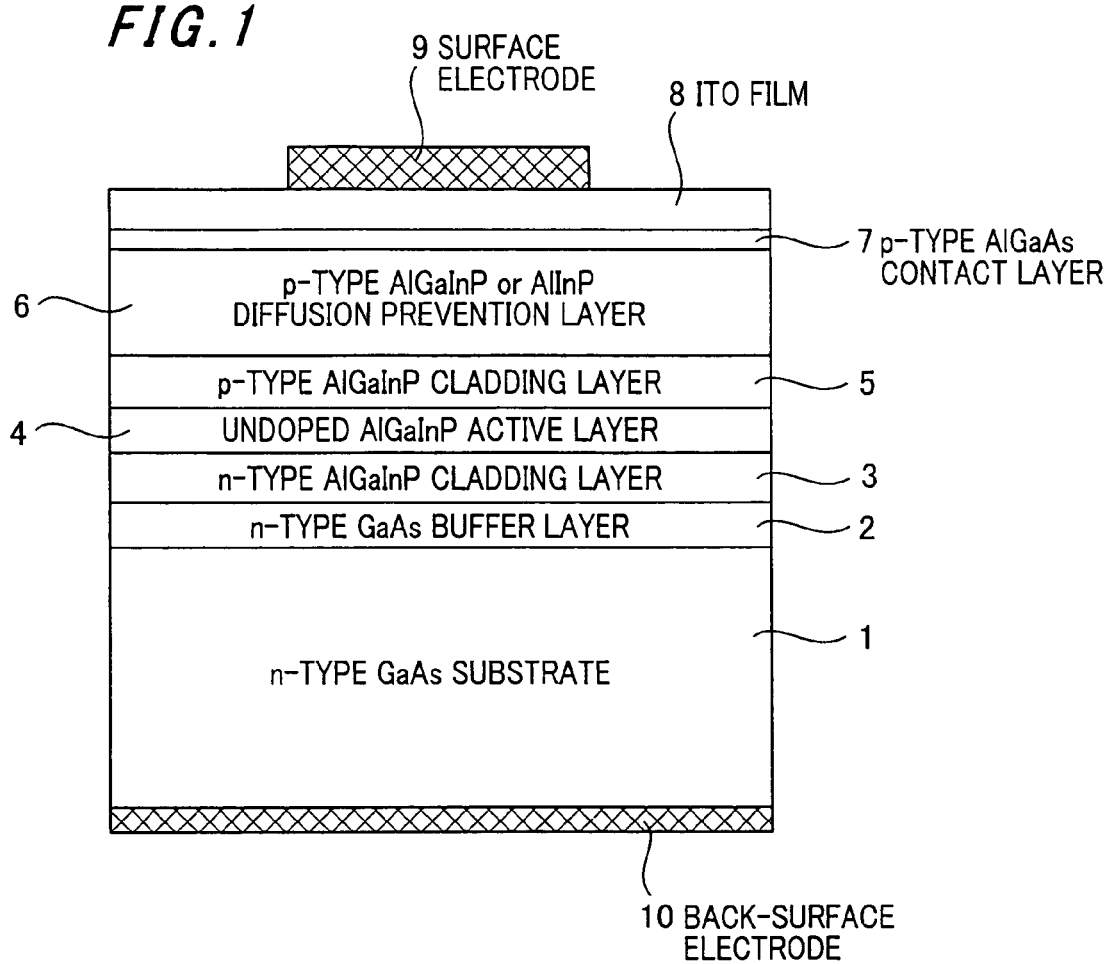
FIG. 1 is a cross sectional view showing an AlGaInP-based red LED in first and second preferred embodiments according to the invention.

FIG. 1 is a cross sectional view showing an AlGaInP-based red LED in the first and second preferred embodiments according to the invention.

The LED is composed of: an n-type GaAs substrate 1 as a semiconductor substrate; an n-type GaAs buffer layer 2; an n-type AlGaInP cladding layer (herein also referred to as n-type cladding layer) 3; an undoped AlGaInP active layer (herein also referred to as active layer) 4; and a p-type AlGaInP cladding layer (herein also referred to as p-type cladding layer) 5, where the n-type buffer layer 2 to the p-type cladding layer 5 are in this order grown on the n-type GaAs substrate 1 so as to form a light emitting portion. Further, grown on the top layer, i.e., on the p-type cladding layer 5 is an As-based p-type AlGaAs contact layer (herein also referred to as p-type contact layer) 7 with a p-type dopant doped therein at a high concentration. Further, grown on the p-type contact layer 7 is an ITO film 8 which is a transparent conductive film of a metal oxide material and serves as a current spreading layer. On the ITO film 8, a surface electrode 9 is formed. On the opposite side, a back-surface electrode 10 is formed.

The n-type cladding layer 3, the active layer 4 and the p-type cladding layer 5 are composed of $(Al_XGa_{1-X})_YIn_{1-Y}P$ ($0 \leq X \leq 1$, $0.4 \leq Y \leq 0.6$).

The p-type contact layer 7 is composed of $Al_xGa_{1-x}As$ ($0 \leq X \leq 0.2$) and has a thickness of 1 nm or more and 30 nm or less. It is doped with Zn, a p-dopant and has a high carrier concentration of $1 \times 10^{19}/cm^3$ or more.

The ITO film 8, the current spreading layer has a thickness D to satisfy $(7/10)d \leq D \leq (13/10)d$, where a thickness d of an ideal current spreading layer is $d = A \times \lambda_P/(4 \times n)$, A: a constant, $\lambda_P$: an emission peak wavelength of the light emitting device, and n: a refractive index of the current spreading layer, and the constant A is preferably a positive odd number. The ITO film 8 is formed by vacuum deposition or sputtering and has a carrier concentration of $8 \times 10^{20}/cm^3$ or more just after the film formation.

The light emitting device of the invention is featured in that between the p-type contact layer 7 and the p-type cladding layer 5 is grown a p-type diffusion prevention layer 6 which contains phosphorus (P), a group V element and is composed of a group III–V semiconductor, and which matches in crystalline lattice to the n-type GaAs substrate 1, the semiconductor substrate. The p-type diffusion prevention layer 6 is, for example, composed of AlGaInP or AlInP which is transparent to the emission wavelength, and it is formed 0.5 μm or more and 5 μm or less in thickness.

Thus, the p-type diffusion prevention layer 6 can have an excellent initial characteristics and a high reliability since it is composed of AlGaInP or AlInP containing P as the group V element without being composed of As-based material, e.g., an AlGaAs layer with a high Al composition, which is transparent to the active layer. Further, it does not comprise a wide bandgap material, such as P-based GaP, which does not match in lattice to the substrate, and thus it comprises the AlGaInP or AlInP-based material. Therefore, it allows a reduction in initial operation voltage.

EXAMPLES

In order to confirm the effects of the invention, comparative examples 1 and 2 and examples 1 and 2 are prepared and evaluated as follows.

Comparative Example 1

The p-type Diffusion Prevention Layer Made of AlGaAs

Figure 3:
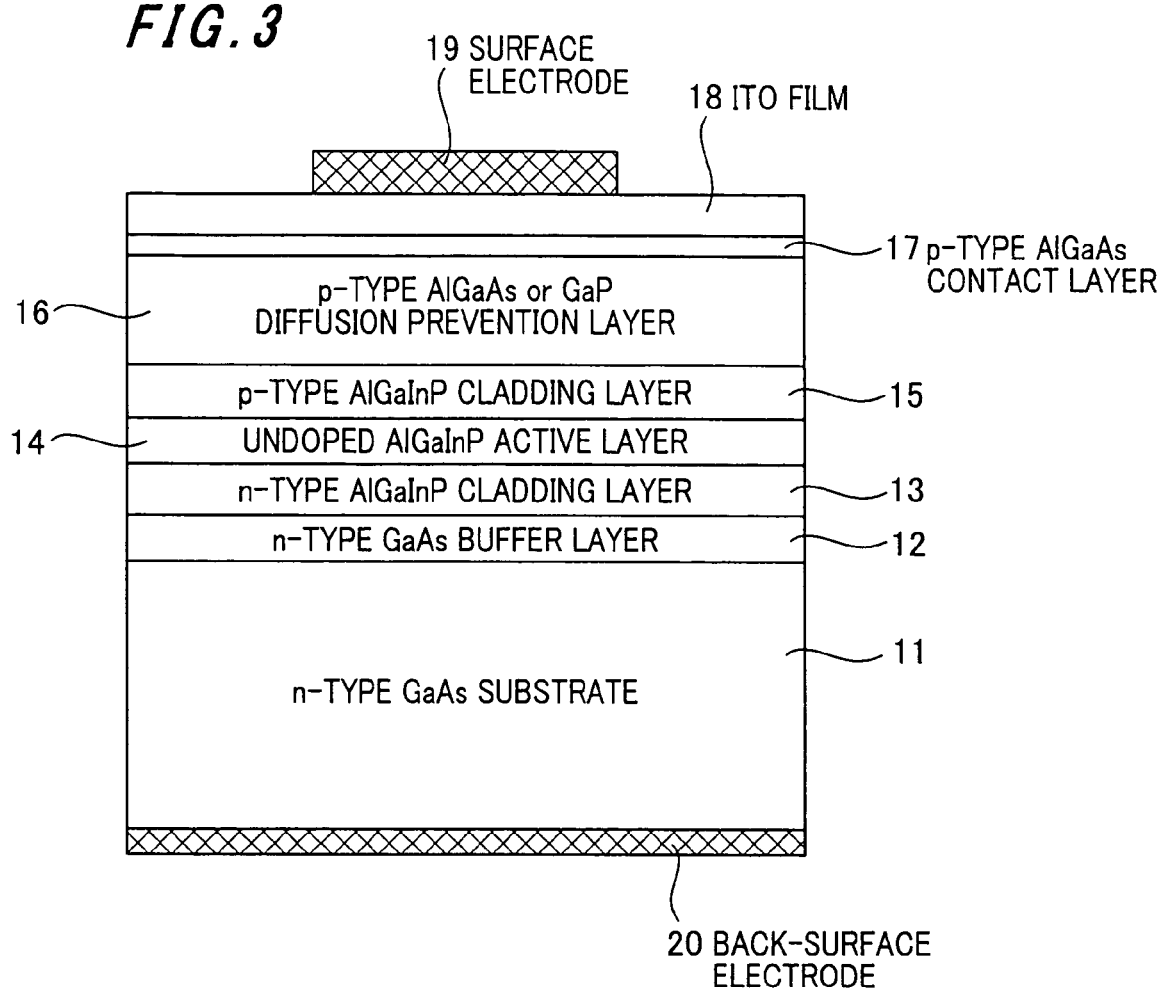
FIG. 3 is cross sectional view showing an AlGaInP-based red LED in Comparative Examples 1 and 2.

Comparative example 1 is structured as shown in FIG. 3 and is fabricated as a red LED epitaxial wafer with an emission wavelength of about 630 nm. The epitaxial growth method, epitaxial layer's thickness, epitaxial structure, electrode formation method and LED fabrication method are as follows.

On an n-type GaAs substrate 11 are by MOVPE sequentially grown: an n-type (Si-doped) GaAs buffer layer 12 (200 nm in thickness and $1 \times 10^{18}/cm^3$ in carrier concentration); an n-type (Se-doped) $(Al_{0.7}Ga_{0.3})_{0.5}In_{0.5}P$ cladding layer 13 (400 nm in thickness and $1 \times 10^{18}/cm^3$ in carrier concentration); an undoped $(Al_{0.1}Ga_{0.9})_{0.5}In_{0.5}P$ active layer 14 (600 nm in thickness); a p-type (Mg-doped) $(Al_{0.7}Ga_{0.3})_{0.5}In_{0.5}P$ cladding layer 15 (400 nm in thickness and $1 \times 10^{18}/cm^3$ in carrier concentration); a p-type (Mg-doped) $Al_{0.8}Ga_{0.2}As$ diffusion prevention layer 16 (2 μm in thickness and $1 \times 10^{18}/cm^3$ in carrier concentration); and a p-type (Zn-doped) $Al_{0.1}Ga_{0.9}As$ contact layer 17 (3 μm in thickness and $7 \times 10^{19}/cm^3$ in carrier concentration).

In the MOVPE, the n-type GaAs buffer layer 12 to the p-type diffusion prevention layer 16 are grown at 650° C. and the p-type contact layer 17 is grown at 550° C. Other growth conditions are a growth pressure of about 6666 Pa (50 Torr), a growth speed of 0.3 to 1.0 nm/sec in respective layers, and a V/III ratio of about 200. However, the V/III ratio of p-type diffusion prevention layer 16 and the p-type contact layer 17 is 10. Meanwhile, the V/III ratio means a value obtained by dividing a mole number of a group V material such as $AsH_3$ and $PH_3$ by a mole number of a group III material such as TMGa and TMAl.

Source materials used in the MOVPE growth are an organic metal material such as trimethylgallium (TMGa) or triethylgallium (TEGa), trimethylaluminum (TMAl) and trimethylindium (TMIn), and a hydride gas such as arsine ($AsH_3$) and phosphine ($PH_3$). For example, a material doped into an n-type layer such as the n-type GaAs buffer layer 12 is disilane ($Si_2H_6$). A conduction-type determining impurity material doped into a p-type layer such as the p-type cladding layer 15 is biscyclopentadienylmagnesium ($Cp_2Mg$). However, diethylzinc (DEZn) is used only for the p-type contact layer 17.

Alternatively, a conduction-type determining impurity material doped into an n-type layer may be hydrogen selenide ($H_2Se$), monosilane ($SiH_4$), diethyltellurium (DETe), or dimethyltellurium (DMTe). Other p-type dopant materials for the p-cladding layer and p-type diffusion prevention layer may be dimethylzinc (DMZn) or diethylzinc (DEZn).

After taking the LED epitaxial wafer out from the MOVPE apparatus, the ITO film 18 is formed 270 μm thick by vacuum deposition on the surface of the wafer, i.e., on the surface of the p-type contact layer 17. In this structure, the ITO film 18 serves as the current spreading layer.

At that time, an evaluation glass substrate placed in the same batch as the ITO film deposition is taken out and cut into a size suitable for Hall determination to evaluate the electrical characteristics of the ITO film only. As a result, a carrier concentration of $1.09 \times 10^{21}/cm^3$, a mobility of 18.4 $cm^2/Vs$ and a resistivity of $2.88 \times 10^{-4}$ Ω·cm are obtained.

Then, on the epitaxial wafer, circular electrodes with a diameter of 110 μm as a surface electrode 19 are formed in a matrix pattern by vacuum deposition and by using a means such as a resist or mask aligner used in a general photolithography and using known methods. The lift-off method is used in forming the electrode after the deposition. The surface electrode 19 is formed by depositing 20 nm of nickel (Ni) and then 500 nm of gold (Au). Then, a back-surface electrode 20 is formed on the entire bottom face of the epitaxial wafer by vacuum deposition as well. The back-surface electrode 20 is formed by sequentially depositing 60 nm of gold-germanium alloy (AuGe), 10 nm of nickel (Ni) and then 500 nm of gold (Au). Then, it is alloyed by thermally treating at 400° C. for 5 min. in a nitrogen gas atmosphere.

Then, the resultant LED epitaxial wafer with the electrodes is cut by a dicer such that the surface electrode 19 is located at the center of LED. Thus, an LED bare chip with a chip size of 300 μm square is fabricated. The LED bare chip is then mounted (die-bonded) on a TO-18 stem, and then a wire is bonded to the LED bare chip. The LED is thus fabricated.

In evaluating the initial characteristics of the LED thus fabricated, the LED can be obtained which has a light output of 0.95 mW and an operation voltage of 1.84 V in 20 mA current supply (at the time of evaluation).

Further, a continuous current supply test is conducted such that the LED is operated in 50 mA current supply at room temperature and normal humidity during 168 hours (one week). As a result, as compared to the initial characteristics before the test, the light output is 52% and the operation voltage is +0.06 V (about 3% increased).

The SIMS analysis is conducted with the LED's before and after the continuous current supply test. As a result, in the LED of comparative example 1 after the continuous current supply test, it is confirmed that Zn, the dopant for the p-type contact layer, diffuses into the active layer. It is assumed that the lifetime, i.e., reliability of the LED of comparative example is reduced due to the dopant diffusion.

Comparative Example 2

The p-type Diffusion Prevention Layer Made of GaP

Comparative example 2 is structured as shown in FIG. 3 and is fabricated as a red LED epitaxial wafer with an emission wavelength of about 630 nm. The epitaxial growth method, epitaxial layer's thickness, epitaxial structure, electrode formation method and LED fabrication method are almost the same as comparative example 1.

Comparative example 2 is different from comparative example 1 only in that the p-type diffusion prevention layer 16 is made of GaP. The p-type diffusion prevention layer 16 has the same thickness, 2 µm, as that in comparative example 1. Also, it has the same carrier concentration and dopant as that of comparative example 1.

Further, the LED epitaxial wafer thus fabricated is processed into LED chips in the same manner as comparative example 1.

In evaluating the initial characteristics of the LED thus fabricated, the LED can be obtained which has a light output of 1.03 mW and an operation voltage of 1.96 V in 20 mA current supply (at the time of evaluation).

Further, a continuous current supply test is conducted under the same conditions as comparative example 1. As a result, as compared to the initial characteristics before the test, the light output is 102% and the operation voltage is +0.008 V (about 0.4% increased).

As described above, since the p-type diffusion prevention layer is made of GaP containing P as the group V element without being made of As-based material, e.g., an AlGaAs layer with a high Al composition, which is transparent to the active layer, the LED can have a high reliability. However, GaP causes a large mismatch in lattice constant relative to the substrate or a quaternary semiconductor material such as the cladding layer. Further, a large potential barrier can be generated between the GaP layer and the p-cladding layer since a large band discontinuity may be made therebetween depending on the junction position of band. Therefore, the operation voltage must be increased.

Thus, in comparative example 2, although the lifetime of the LED can be improved by using GaP as a P-based material, there is a problem that the operation voltage of LED must be significantly increased.

Example 1

The p-type Diffusion Prevention Layer Made of AlGaInP

Example 1 is structured as shown in FIG. 1 and is fabricated as a red LED epitaxial wafer with an emission wavelength of about 630 nm. The epitaxial growth method, epitaxial layer's thickness, epitaxial structure, electrode formation method and LED fabrication method are almost the same as comparative example 1.

Example 1 is different from comparative example 1 only in that the p-type diffusion prevention layer 6 is made of $(Al_{0.8}Ga_{0.2})_{0.5}In_{0.5}P$. The p-type diffusion prevention layer 6 has the same thickness, 2 µm, as that in comparative example 1. Also, it has the same carrier concentration and dopant as that of comparative example 1. Namely, the p-type diffusion prevention layer 6 is of Mg-doped $(Al_{0.8}Ga_{0.2})_{0.5}In_{0.5}P$, 2 µm in thickness and $1\times10^8/cm^3$ in carrier concentration.

Further, the LED epitaxial wafer thus fabricated is processed into LED chips in the same manner as comparative example 1.

In evaluating the initial characteristics of the LED thus fabricated, the LED can be obtained which has excellent initial characteristics, i.e., a light output of 1.05 mW and an operation voltage of 1.84 V in 20 mA current supply (at the time of evaluation).

Further, a continuous current supply test is conducted under the same conditions as comparative example 1. As a result, as compared to the initial characteristics before the test, the light output is 102% and the operation voltage is +0.004 V (about 0.2% increased).

As described above, since the p-type diffusion prevention layer is made of AlGaInP containing P as the group V element without being made of As-based material, e.g., an AlGaAs layer with a high Al composition, which is transparent to the active layer, the LED can have excellent initial characteristics and a high reliability. Also, since it is made of the AlGaInP-based material to be lattice-matched to the substrate without being made of a wide bandgap material such as GaP, one of P-based materials, to cause a lattice mismatch, the initial operation voltage can be reduced.

The SIMS analysis is conducted with the LED's before and after the continuous current supply test, in the same manner as comparative example 1. As a result, in the LED of example 1 after the continuous current supply test, it is confirmed that Zn, the dopant for the p-type contact layer, nearly does not diffuse into the active layer. Namely, as shown in example 1, the dopant diffusion of the LED can be prevented by the p-type diffusion prevention layer 6 made of AlGaInP.

Example 2

The p-type Diffusion Prevention Layer Made of AlInP

Example 2 is structured as shown in FIG. 1 and is fabricated as a red LED epitaxial wafer with an emission wavelength of about 630 nm. The epitaxial growth method, epitaxial layer's thickness, epitaxial structure, electrode formation method and LED fabrication method are almost the same as comparative example 1.

Example 2 is different from comparative example 1 only in that the p-type diffusion prevention layer 6 is made of AlInP. The p-type diffusion prevention layer 6 has the same thickness, 2 µm, as that in comparative example 1. Also, it has the same carrier concentration and dopant as that of comparative example 1. Namely, the p-type diffusion prevention layer 6 is of Mg-doped AlInP, 2 µm in thickness and $1\times10^{18}/cm^3$ in carrier concentration.

Further, the LED epitaxial wafer thus fabricated is processed into LED chips in the same manner as comparative example 1.

In evaluating the initial characteristics of the LED thus fabricated, the LED can be obtained which has excellent initial characteristics, i.e., a light output of 1.06 mW and an operation voltage of 1.84 V in 20 mA current supply (at the time of evaluation).

Further, a continuous current supply test is conducted under the same conditions as comparative example 1. As a result, as compared to the initial characteristics before the test, the light output is 101% and the operation voltage is +0.004 V (about 0.2% increased).

As described above, since the p-type diffusion prevention layer is made of AlInP containing P as the group V element without being made of As-based material, e.g., an AlGaAs layer with a high Al composition, which is transparent to the active layer, the LED can have excellent initial characteristics and a high reliability. Also, since it is made of the AlInP-based material to be lattice-matched to the substrate without being made of a wide bandgap material such as GaP, one of P-based materials, to cause a lattice mismatch, the initial operation voltage can be reduced.

The SIMS analysis is conducted with the LED's before and after the continuous current supply test, in the same manner as comparative example 1. As a result, in the LED of example 2 after the continuous current supply test, it is confirmed that Zn, the dopant for the p-type contact layer, nearly does not diffuse into the active layer. Namely, as shown in example 2, the dopant diffusion of the LED can be prevented by the p-type diffusion prevention layer 6 made of AlInP.

<Optimization Conditions>

The first condition is that an ohmic contact layer in contact with the current spreading layer of metal oxide, e.g., an ITO film needs to be doped with a conduction type determining impurity at a significantly high concentration. For example, in case of a zinc(Zn)-doped contact layer, it is desired that the crystal material is GaAs or AlGaAs with a Al composition ration of 0 to 0.2 and has a carrier concentration of $1 \times 10^{19}/cm^3$ or more, which is more desirable as it increases. The ITO film belongs to n-type semiconductor materials and the LED is in general formed to be the p-side up. Therefore, the LED using the ITO film as a current spreading layer often has an n/p/n junction in conduction type viewed from the substrate side. Thus, a large potential barrier is generated at the interface of the ITO film and the contact layer and, therefore, the LED will be generally provided with a high operation voltage. To solve the problem, the p-type contact layer needs to have a very high carrier concentration. Therefore, the above contact layer has a narrow bandgap to facilitate a higher carrier concentration thereof.

Further, in conjunction with the high carrier concentration of the contact layer, the carrier concentration of the ITO film adjacent to the contact layer is also important to reduce the tunnel voltage. For the same reason as that for the contact layer abovementioned, it is desirable that the carrier concentration is as high as possible. In detail, it is preferred that the ITO film has a carrier concentration of $8 \times 10^{20}/cm^3$ or more.

The second condition is that the thickness of the contact layer falls within 1 nm to 30 nm. This is because the contact layer has a bandgap to absorb light emitted from the active layer and, therefore, as the thickness increases, the light output decreases as shown in FIG. 2.

Figure 2:
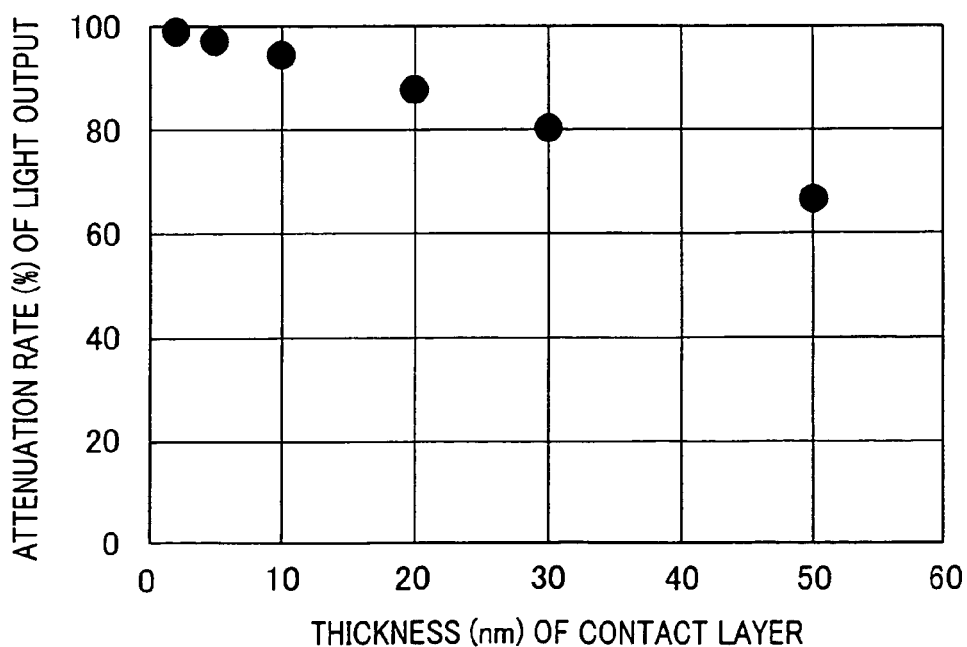
FIG. 2 is a graph showing a relationship between the thickness of a contact layer and the attenuation rate of light output.

Thus, as seen from FIG. 2, it is desirable that the contact layer has a maximum thickness of 30 nm, more preferably 25 nm. On the other hand, if the thickness of the contact layer is less than 1 nm, it becomes difficult to have the tunnel junction between the ITO film and the contact layer and, thereby, it becomes difficult to keep the operation voltage low or to stabilize the operation voltage. Accordingly, the optimum thickness of the contact layer in contact with the ITO film is to be 1 nm to 30 nm.

The third condition is that the ITO film (current spreading layer) has a thickness D to satisfy $(7/10)d \leq D \leq (13/10)d$, where a thickness d of an ideal current spreading layer is $d = A \times \lambda_P/(4 \times n)$, A: a constant, $\lambda_P$: an emission peak wavelength of the light emitting device, and n: a refractive index of the current spreading layer, and the constant A is preferably a positive odd number.

The ITO film formed on the LED epitaxial wafer serves optically as a reflection prevention film since it has a refractive index of nearly an intermediate value between the semiconductor layer and the air layer. Therefore, it is desired that the film thickness is designed based on the above expression so as to enhance the light extraction efficiency of LED to obtain a light emitting device with a higher light output.

However, though it is obvious, as the thickness of the ITO film increases, the transmittance thereof deteriorates. When the intrinsic transmittance of the ITO film lowers, the rate of light to be absorbed by the ITO film of emitted light from the active layer increases and, therefore, the light output lowers.

Figure 4:
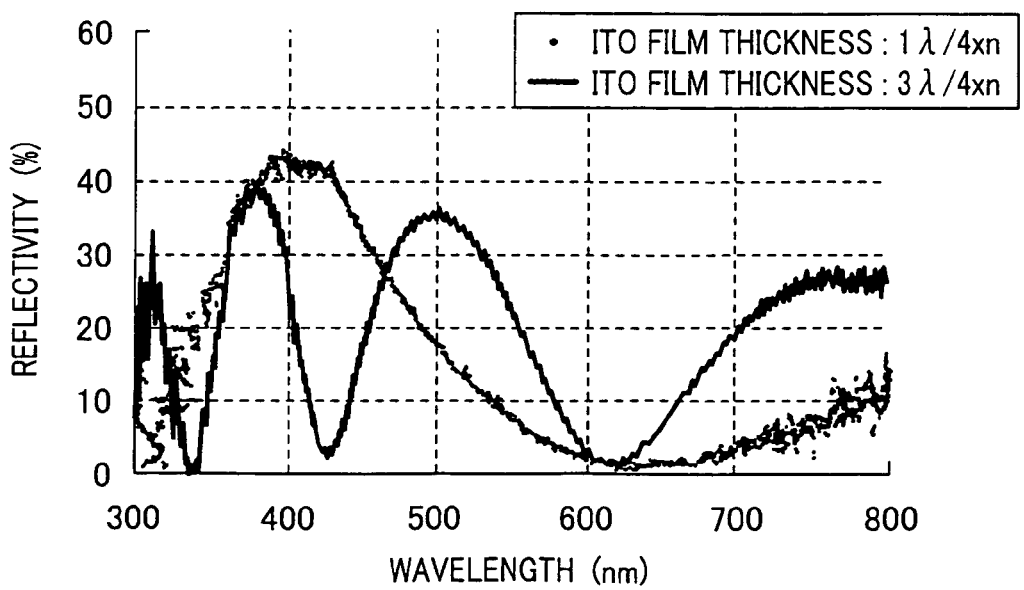
FIG. 4 is a spectrum diagram showing the reflectivity of an ITO film formed on a GaAs substrate.

Further, as the thickness of the current spreading layer increases, an optical interference in the current spreading layer increases and a wavelength region with a high light extraction efficiency narrows. In this regard, FIG. 4 shows the spectra of reflected light when light is perpendicularly irradiated to ITO film suitably formed on a GaAs substrate.

For the above reasons, a desired (ideal) thickness d of the current spreading layer satisfies the above equation and it is desirable that the constant A is 1 or 3. The most desirable example is the constant A=1. Further, the thickness D of the current spreading layer such as an ITO film formed on the LED epitaxial layer needs to be within ±30% of the ideal thickness d of the current spreading layer obtained by the above equation. In other words, the thickness D only needs to satisfy the expression: $(7/10)d \leq D \leq (13/10)d$. This is because a wavelength region with an optically low reflectivity in the reflection prevention film, i.e., a wavelength region with a high light extraction efficiency has a certain width. For example, a tolerance value of the thickness D to allow 15% or less of reflectivity in irradiating light perpendicularly to the LED epitaxial wafer with the ITO film can fall within ±30% of the thickness d obtained by the above equation. If the thickness D is greater than or less than ±30% of the thickness d, the effect of the reflection prevention film will be reduced and, therefore, the light output of the LED lowers.

The fourth condition is that the p-type diffusion prevention layer inserted between the contact layer and the p-type cladding layer has preferably a thickness of 0.5 μm or more and 5 μm or less. A reason to be 0.5 μm or more is that, when the distance of the active layer and the surface electrode is too short, the LED may be broken by ultrasonic vibration in the wire bonding process of the LED fabrication. A reason to be 5 μm or less is that the current spreading property of LED can be sufficiently obtained by the ITO film formed on the contact layer as well as the p-type diffusion prevention layer. Thus, the p-type diffusion prevention layer is not always required such that it gives the current spreading property. Even if provided with a thick p-type diffusion prevention layer of 10 μm or so, the light output of LED does not increase so much since the ITO film is dominant in current spreading property rather than the p-type diffusion prevention layer. Instead, the manufacturing cost of LED is increased and thereby the production cost of the LED is increased. Accordingly, the p-type diffusion prevention layer has preferably a thickness of 0.5 μm or more and 5 μm or less.

Other Embodiments (1) In the above embodiments (or examples), no layer is provided between the active layer and the cladding layer. However, a modification can be made that provided therebetween is, for example, an intrinsic undoped layer, a pseudo undoped layer such as a layer to be regarded as an undoped layer though it contains a little conduction-type determining impurity, or a low-carrier concentration cladding layer with a relatively low carrier concentration. Even in such a structure, the above-mentioned effects of the invention can be obtained as well as additional effects such as an enhancement in output reliability of LED.

(2) In the above embodiments (or examples), the red LED with an emission wavelength of 630 nm is fabricated. However, a modification can be made that other LED with an emission wavelength of 560 to 660 nm is fabricated by using the same AlGaInP-based materials. In this case, the material and carrier concentration of the respective layer need not be changed. Especially, concerning the window layer, no change is made. Therefore, although the modification has an emission wavelength different from the above embodiments, it can also have the same effects as obtained in the invention.

(3) In the above embodiments (or examples), the n-type cladding layer is formed directly on the buffer layer. However, a DBR (distributed Bragg reflector) may be provided, for example, between the buffer layer and the n-type cladding layer.

(4) In the above embodiments (or examples), the surface electrode 9 is formed circular. However, it may be in other form, e.g., rectangular, rhombic or polygonal.

(5) In the above embodiments (or examples), the semiconductor substrate is made of GaAs. However, the effects of the invention can be also obtained in an LED epitaxial wafer with a Ge starting substrate or in an LED epitaxial wafer composed such that a GaAs or Ge starting substrate is used and then removed and further a Si substrate or a metal substrate with a thermal conductivity greater than Si is instead attached thereto as a substitution self-standing substrate.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting device, comprising:
a semiconductor substrate;
a semiconductor layer comprising an n-type cladding layer, an active layer, a p-type cladding layer and a p-type contact layer, wherein the p-type contact layer comprises an As-based material and is located at the top of the semiconductor layer and doped with a p-type dopant comprising zinc at a concentration of $1\times10^{19}/cm^3$ or more;
a current spreading layer formed on the semiconductor layer and comprising a metal oxide material; and
a diffusion prevention layer formed between the p-type contact layer and the p-type cladding layer,
wherein the diffusion prevention layer comprises a group III–V semiconductor that comprises phosphorus as a group V element and has a crystal lattice mismatch ratio of within ±0.3% to the semiconductor substrate.

2. The semiconductor light emitting device according to claim 1, wherein:
the current spading layer comprises indium tin oxide (ITO).

3. The semiconductor light emitting device according to claim 2, wherein:
the current spreading layer comprises a thickness D to satisfy $(7/10)d \leq D \leq (13/10)d$, where a thickness d of an ideal current spreading layer is $d = A \times \lambda_p/(4 \times n)$, A: a constant, $\lambda_p$: an emission peak wavelength of the light emitting device, and n: a refractive index of the current spreading layer, and the constant A is a positive odd number.

4. The semiconductor light emitting device according to claim 3, wherein:
the current spreading layer has a carrier concentration of $8\times10^{20}/cm^3$ or more.

5. The semiconductor light emitting device according to claim 4, wherein:
the n-type cladding layer, the active layer and the p-type cladding layer are composed of $(Al_XGa_{1-X})_YIn_{1-Y}P$, where $0 \leq X \leq 1$ and $0.4 \leq Y \leq 0.6$ are satisfied.

6. The semiconductor light emitting device according to claim 5, wherein:
the p-type contact layer doped with the p-type dopant comprising zinc at a carrier concentration of $1\times10^{19}/cm^3$ or more is composed of $Al_XGa_{1-X}As$, where $0 \leq X \leq 0.2$ is satisfied.

7. The semiconductor light emitting device according to claim 6, wherein:
the p-contact layer has a thickness of 1 nm or more and 30 nm or less.

8. The semiconductor light emitting device according to claim 7, wherein:
the diffusion prevention layer has a thickness of 0.5 μm or more and 5 μm or less.

9. The semiconductor light emitting device according to claim 8, wherein:
the diffusion prevention layer is optically transparent to an emission wavelength of the semiconductor light emitting device.

10. The semiconductor light emitting device according to claim 9, wherein:
the diffusion prevention layer is composed of AlInP or AlGaInP.

11. The semiconductor light emitting device according to claim 3, wherein:
the current spreading layer is formed by vacuum deposition or sputtering.

12. The semiconductor light emitting device according to claim 4, wherein:
the current spreading layer has the carrier concentration of $8\times10^{20}/cm^3$ or more just after the current spreading layer is formed.

* * * * *